(12) United States Patent
Jeong

(10) Patent No.: US 6,961,278 B2
(45) Date of Patent: Nov. 1, 2005

(54) SYNCHRONOUS SELF REFRESH EXIT CONTROL METHOD AND CIRCUIT IN SEMICONDUCTOR MEMORY DEVICE

(75) Inventor: Jeong-Su Jeong, Ichon-shi (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 10/747,937

(22) Filed: Dec. 29, 2003

(65) Prior Publication Data

US 2004/0240296 A1 Dec. 2, 2004

(30) Foreign Application Priority Data

May 29, 2003 (KR) .............................. 10-2003-0034314

(51) Int. Cl.$^7$ ................................................. G11C 7/00
(52) U.S. Cl. ....................................... 365/222; 365/233
(58) Field of Search ................................ 365/222, 233, 365/230.08, 189.05

(56) References Cited

U.S. PATENT DOCUMENTS 6,081,468 A * 6/2000 Taira et al. .................. 365/203
6,421,281 B2 * 7/2002 Suzuki ...................... 365/189.09

FOREIGN PATENT DOCUMENTS

JP 2000-030438 1/2000
KR 10-2001-0026122 4/2001

* cited by examiner

Primary Examiner—Thong Q. Le
(74) Attorney, Agent, or Firm—Blakely, Sokoloff, Taylor & Zafman

(57) ABSTRACT

A self refresh control device, for use in a semiconductor memory device, comprises a self refresh entry unit having at least one clock buffer for generating a self refresh entry signal in response to an external control signal, wherein the clock buffer generates a clock signal in response to an external clock signal and a clock buffer enable signal; a self refresh exit unit for generating a first self refresh exit signal in response to the external control signal and generating a second self refresh exit signal synchronized with the clock signal; a clock buffer controller for generating the clock buffer enable signal in response to the first self refresh exit signal; and a self refresh signal generator for generating a self refresh signal in response to the self refresh entry signal and the second self refresh exit signal.

13 Claims, 6 Drawing Sheets

SYNCHRONOUS SELF REFRESH EXIT CONTROL METHOD AND CIRCUIT IN SEMICONDUCTOR MEMORY DEVICE

FIELD OF INVENTION

The present invention relates to a semiconductor memory device; and, more particularly, to a semiconductor memory device for controlling a synchronous self refresh exit operation for reducing a current consumed during self refresh operation.

DESCRIPTION OF PRIOR ART

FIG. 1 is a block diagram showing a self refresh control circuit in a conventional semiconductor memory device for controlling a self refresh exit operation.

As shown, the self refresh control circuit includes a self refresh entry unit 100, a self refresh exit unit 200 and a self refresh signal generator 5.

The self refresh entry unit 100 generates a self refresh entry signal SREF_EN for starting a self refresh operation. The self refresh exit unit 200 generates a self refresh exit signal CKE_SREF_SYN for exiting from the self refresh operation.

The self refresh signal generator 5 receives the self refresh entry signal SREF_EN and the self refresh exit signal CKE_SREF_EN and generates a self refresh signal SREF in response to the two received signals SREF_EN and CKE_SREF_EN.

The self refresh entry unit 100 includes a first buffer unit 1 and a self refresh entry command generator 3. The self refresh exit unit 200 includes a second buffer unit 2 and a synchronizing circuit unit 4.

The first buffer unit 1 includes a command buffer 11, a first clock enable buffer 12 and a first clock buffer 13.

The command buffer 11 receives external signals, i.e., a row address strobe signal RASB, a column address strobe signal CASB, a writing enable signal WEB and a chip selection signal CSB to generate internal signals, i.e., an internal row address strobe signal RASBI, an internal column address strobe signal CASBI, an internal writing enable signal WEBI and an internal chip selection signal CSBI.

The first clock enable buffer 12 receives an external clock enable signal CKE and generates an internal clock enable signal CKEI. The first clock buffer 13 receives an external clock signal CLK and generates an internal clock signal CLKI.

The above blocks 11, 12, and 13 also receive a feedbacked self refresh signal SREF. Depending on the feedbacked self refresh signal SREF, the blocks 11, 12 and 13 are enabled or disabled.

If the self refresh signal SREF is activated to a logic 'HIGH' level, the blocks 11, 12, and 13 are disabled; on the other hand, if the self refresh signal SREF is inactivated to a logic 'LOW' level, the blocks 11, 12 and 13 are enabled. That is, the first buffer unit 1 is disabled during the self refresh operation.

The second buffer unit 2 includes a second clock enable buffer 21 and a second clock buffer 22. The second clock enable buffer 21 and the second clock buffer 22 receive the feedbacked self refresh signal SREF. Depending on the feedbacked self refresh signal SREF, the blocks 21 and 22 are enabled or disabled.

If the self refresh signal SREF is inactivated to a logic 'LOW' level, the second clock enable buffer 21 is enabled and outputs a self refresh exit control signal CKE_SREF to the synchronizing circuit unit 4, wherein the self refresh exit control signal CKE_SREF is not synchronized with the external clock signal CLK.

The second clock buffer 22 generates a clock synchronizing signal CLK_SREF for synchronizing the self refresh exit control signal CKE_SREF with the external clock signal CLK.

As described above, the conventional semiconductor memory device includes the second buffer unit 2 besides the first buffer unit 1. The second clock enable buffer 21 and the second clock buffer 22 are included in the second buffer unit 2. This is for receiving the clock enable signal CKE and the external clock signal CLK to control the self refresh exit operation. The first enable buffer 12 and the first clock buffer 13 are not used in order to reduce power consumption during the self refresh operation.

The self refresh entry command generator 3 generates the self refresh entry signal SREF_EN. If an auto refresh command signal AREF (now shown) is inputted when the clock enable signal CKE is in a logic 'LOW' level, the self refresh entry command generator 3 generates the self refresh entry signal SREF_EN synchronized with the external clock signal CLK.

The synchronizing circuit unit 4 generates the self refresh exit signal by synchronizing the self refresh exit control signal CKE_SREF with the clock synchronizing signal CLK_SREF.

The self refresh signal generator 5 is for generating the self refresh signal SREF. The self refresh signal generator 5 controls the self refresh signal SREF to become a logic 'HIGH' level or a logic 'LOW' level depending on the self refresh entry signal SREF_EN and the self refresh exit signal CKE_SREF_SYN, i.e., the self refresh signal generator 5 controls the SREF to become a logic 'HIGH' level if the SREF_EN is activated, or, controls the SREF to become a logic 'LOW' level if the CKE_SREF_SYN is activated.

FIG. 2 is a timing diagram showing the self refresh operation of the conventional semiconductor memory device.

If the external clock signal CLK is inputted, and the clock enable signal CKE and an auto refresh signal AREF are also inputted synchronizing with the external clock signal CLK, the internal clock signal CLKI and the internal clock enable signal CKEI are generated. Herein, the auto refresh signal AREF is a mixed signal from the signals RASB, CASB, WEB, CSB described above.

Thereafter, the self refresh entry signal SREF_EN is generated and inputted to the self refresh signal generator 5. Then, the self refresh signal SREF outputted from the self refresh signal generator 5 becomes in a logic 'HIGH' level.

Therefore, all the buffers except the second clock enable buffer 21 and second clock buffer 22 are disabled for reducing power consumption because the buffers included in the first buffer unit 1 are unnecessary in the self refresh operation.

On the other hand, to exit from the self refresh operation, the self refresh exit control signal CKE_SREF is generated from the second clock enable buffer 21. Then, the self refresh exit signal CKE_SREF_SYN is generated from the synchronizing circuit unit 4 by synchronizing the CKE_SREF with the clock synchronizing signal CLK_SREF.

Thereafter, the self refresh SREF becomes in a logic 'LOW' level by the self refresh signal generator 5 indicating that the semiconductor memory device is out of the self refresh operation.

Subsequently, the buffers 11, 12 and 13 included in the first buffer unit 1 are enabled, and the buffers 21 and 22 included in the second buffer unit 2 are disabled.

As described above, during the self refresh operation, the conventional semiconductor memory device disables other buffers except for the second enable buffer 21 and the second clock buffer 22 in order to reduce power consumption.

However, during the self refresh operation, the buffers 21 and 22 still operate to thereby cause an additional power consumption.

Moreover, in a time period T as shown in FIG. 2, if the clock synchronizing signal CLK_SREF outputted from the second clock buffer 22 keeps toggling during the self refresh operation so that the conventional semiconductor memory device further causes a power consumption.

SUMMARY OF INVENTION

It is, therefore, an object of the present invention to provide a semiconductor memory device controlling a self refresh exit operation for reducing a power consumption during a self refresh operation.

In accordance with an aspect of the present invention, there is provided a self refresh control device including a self refresh entry unit having at least one clock buffer for generating a self refresh entry signal in response to an external control signal, wherein the clock buffer generates a clock signal in response to an external clock signal and a clock buffer enable signal; a self refresh exit unit for generating a first self refresh exit signal in response to the external control signal and generating a second self refresh exit signal synchronized with the clock signal; a clock buffer controller for generating the clock buffer enable signal in response to the first self refresh exit signal; and a self refresh signal generator for generating a self refresh signal in response to the self refresh entry signal and the second self refresh exit signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
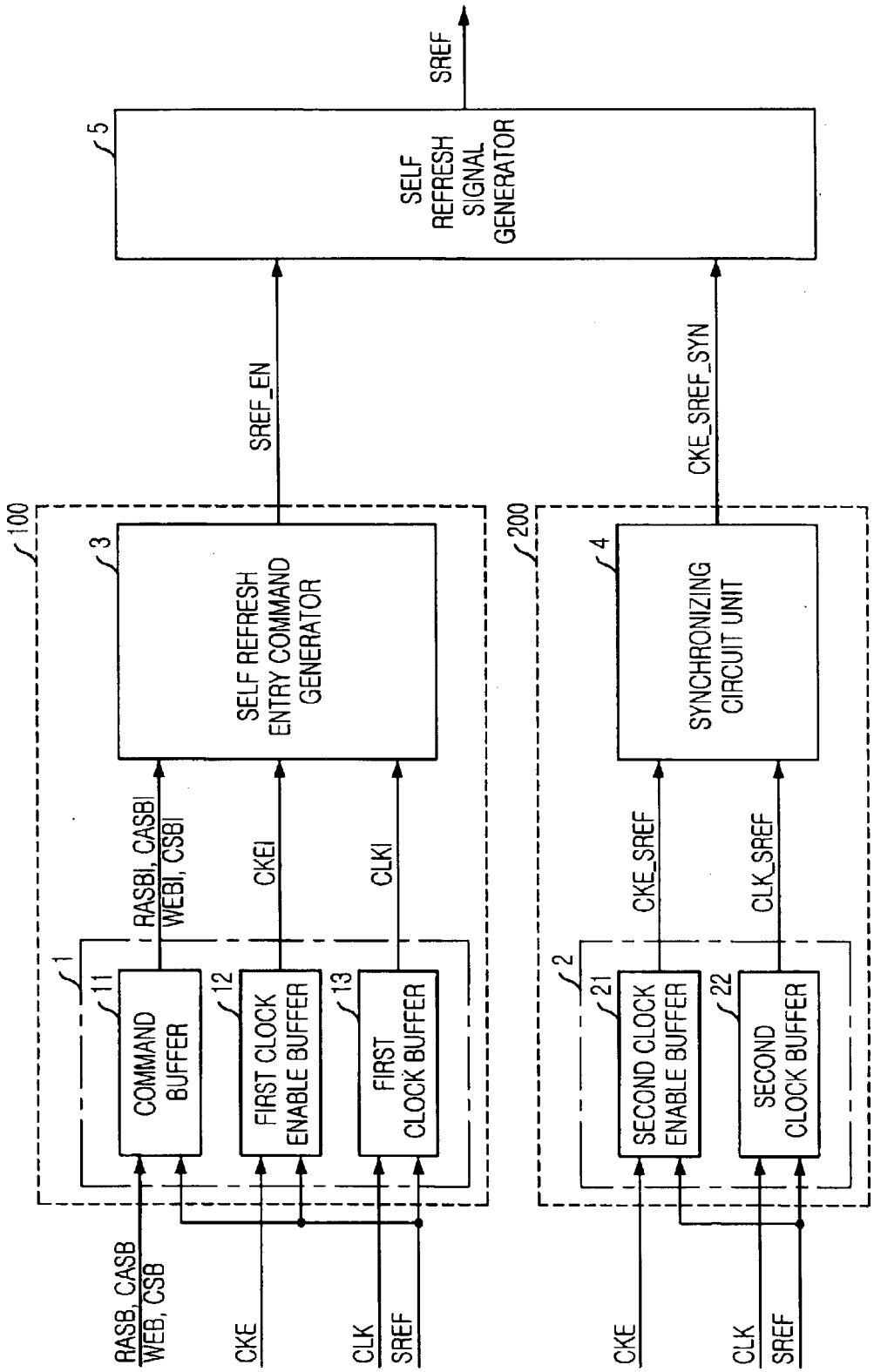
FIG. 1 is a block diagram showing a self refresh control units of a conventional semiconductor memory device.
Figure 2:
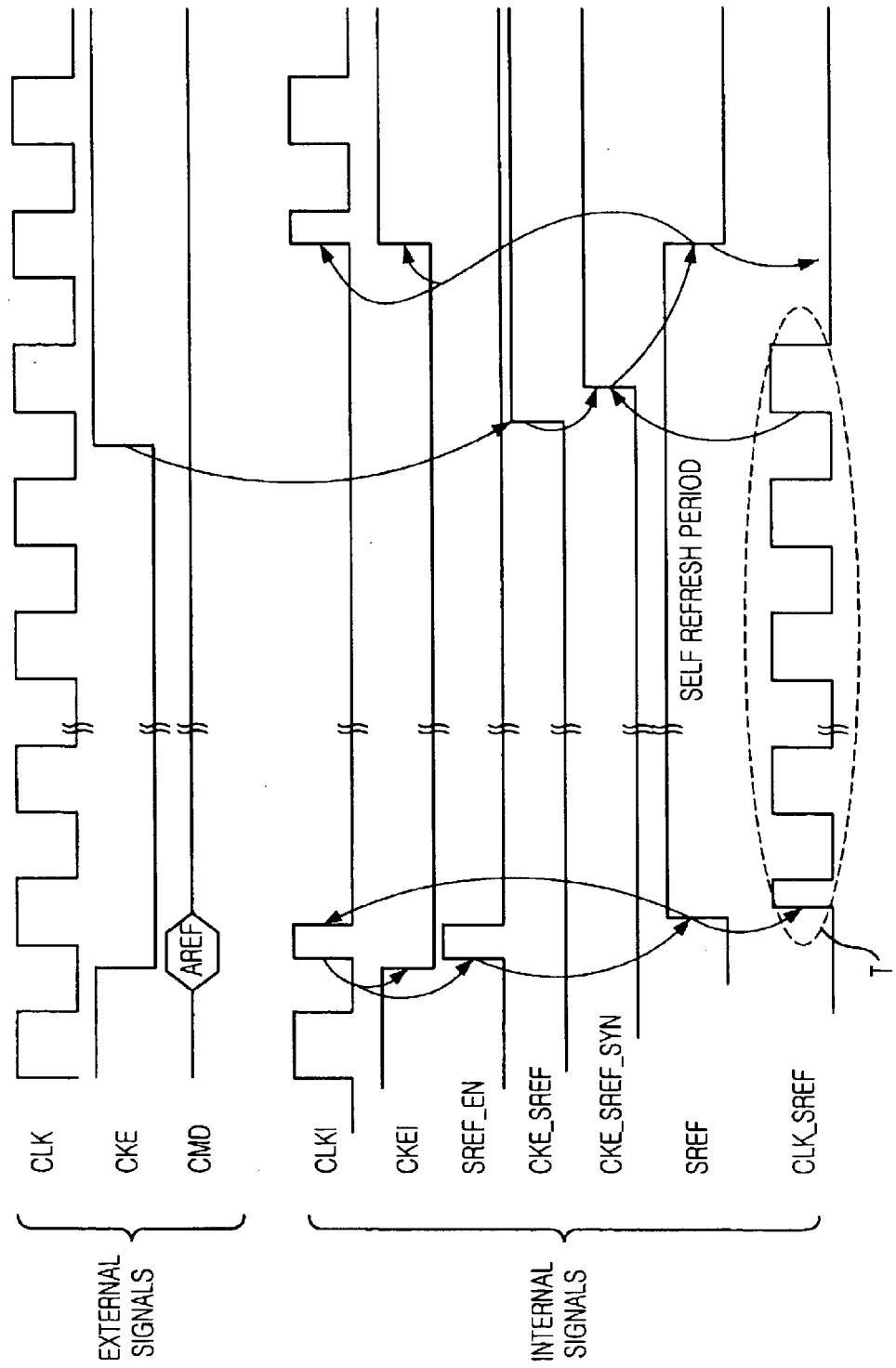
FIG. 2 is a timing diagram demonstrating a self refresh operation of the conventional semiconductor memory device.
Figure 3:
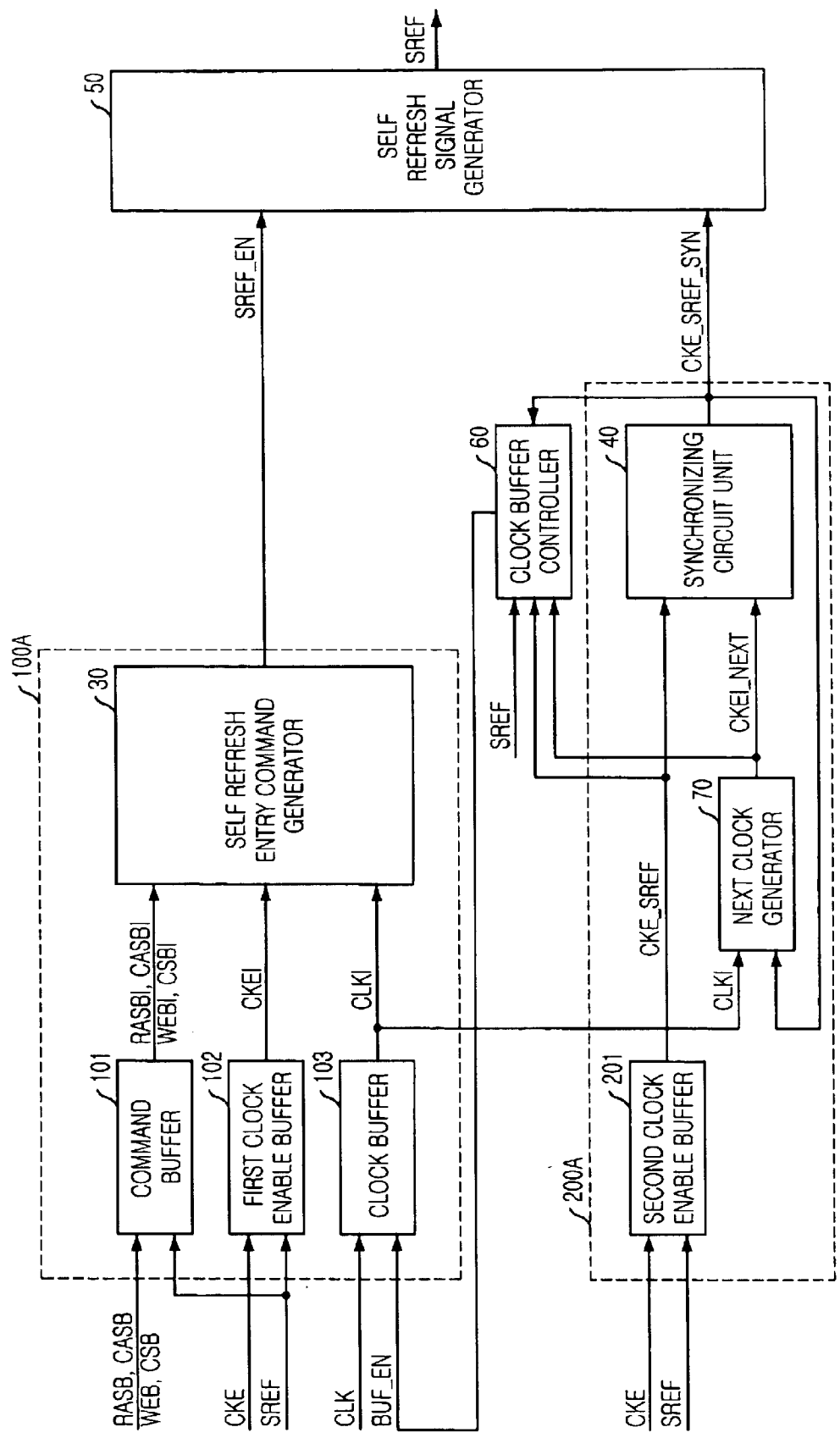
FIG. 3 is a block diagram showing a semiconductor memory device in accordance with the present invention.

FIG. 3 is a block diagram showing the semiconductor memory device in accordance with the present invention.

As shown, the semiconductor memory device includes a self refresh entry unit 100A, a self refresh exit unit 200A, a self refresh signal generator 50 and a clock buffer controller 60.

The self refresh entry unit 100A has a command buffer 101, a first clock enable buffer 102, a clock buffer 103 and a self refresh entry command generator 30.

The self refresh exit unit 200A has a second clock enable buffer 201, a next clock generator 70 and a synchronizing circuit unit 40.

The self refresh entry unit 100A generates a self refresh entry signal SREF_EN synchronizing with an internal clock signal CLKI outputted from the clock buffer 103.

The clock buffer controller generates a buffer control signal BUF_EN for enabling or disabling the clock buffer 103. If the semiconductor memory device is in a self refresh operation, the buffer control signal BUF_EN disables the clock buffer 103; and, if a self refresh exit control signal CKE_SREF is activated during the self refresh operation, the buffer control signal BUF_EN enables the clock buffer 103.

The self refresh exit unit 200A generates a self refresh exit signal CKE_SREF_SYN by synchronizing the self refresh exit control signal CKE_SREF with an internal clock signal CLKI outputted from the clock buffer 103.

The self refresh signal generator 50 generates a self refresh signal SREF in response to the self refresh entry signal SREF_EN and the self refresh exit signal CKE_SREF_SYN.

Therefore, the semiconductor memory device can control entry or exit of the self refresh operation synchronizing with the external clock signal CLK by using one clock buffer, i.e., the clock buffer 103.

The command buffer 101 receives several control signals like a row address strobe signal RASB and a column address strobe signal CASB. The first clock enable buffer 102 receives a clock enable signal CKE. The command buffer 101 and the first clock enable buffer 102 are disabled during the self refresh operation. The clock buffer 103 receives an external clock signal CLK.

The second clock enable buffer 201 receives the clock enable signal CKE operating during the self refresh operation. The self refresh entry command generator 30 outputs a self refresh entry signal SREF_EN in response to outputted signals from the command buffer 101, the first clock enable buffer 102 and the clock buffer 103.

The clock buffer controller 60 disables the clock buffer 103 during the self refresh operation; and, enables the clock buffer 103 if the self refresh exit control signal CKE_SREF is activated.

The next clock generator 70 generates a pulse signal CLKI_NEXT detecting the second clock of the internal clock signal CLKI. The synchronizing circuit unit 40 generates the self refresh exit signal CKE_SREF_SYN by synchronizing the self refresh exit control signal CKE_SREF with the pulse signal CLKI_NEXT.

The command buffer 101 receives a row address strobe signal RASB, a column address signal CASB, a writing enable signal WEB, a chip selection signal CSB and the self refresh signal SREF; and, outputs an internal row address strobe signal RASBI, an internal column address signal CASBI, an internal writing enable signal WEBI and an internal chip selection signal CSB after buffering those received signals.

The first clock enable signal 102 receives the clock enable signal CKE and outputs an internal clock enable signal CKEI. At this time, the self refresh signal SREF generated from the self refresh signal generator 50 is feedbacked and inputted to the command buffer 101 and the first clock enable buffer 103. The two blocks 101 and 102 are disabled or enabled by the feedbacked self refresh signal SREF, i.e., the two blocks 101 and 102 are disabled if the SREF is in a logic 'HIGH' level, and the two blocks 101 and 102 are enabled if the SREF is in a logic 'LOW' level.

The clock buffer 103 is controlled by the buffer control signal BUF_EN. The clock buffer 103 is disabled if the BUF_EN is in a logic 'HIGH' level and enabled if the BUF_EN is in a logic 'LOW' level.

The clock enable buffer 201 is for generating the self refresh exit control signal CKE_SREF. The clock enable buffer 201 is enabled if the refresh signal SREF is in a logic 'HIGH' level and disabled if the refresh signal SREF is in a logic 'LOW' level.

The self refresh entry command generator 30 is for generating the self refresh entry signal SREF_EN. The self refresh entry command generator 30 generates the self refresh entry signal SREF_EN if an auto refresh auto refresh command signal AREF (now shown) is inputted and the clock enable signal CKE is in a logic 'LOW' level.

The synchronizing circuit unit 40 generates the self refresh exit signal CKE_SREF_SYN by synchronizing the self refresh exit control signals CKE_SREF with the pulse signal CLKI_NEXT.

The self refresh signal generator 50 generates the self refresh signal SREF. The self refresh signal SREF becomes in a logic 'HIGH' level or in a logic 'LOW' level. If the self refresh entry signal SREF_EN is activated, the SREF becomes in a logic 'HIGH' level; and, if the self refresh exit signal CKE_SREF_EN is activated, the SREF becomes in a logic 'LOW' level.

Figure 4:
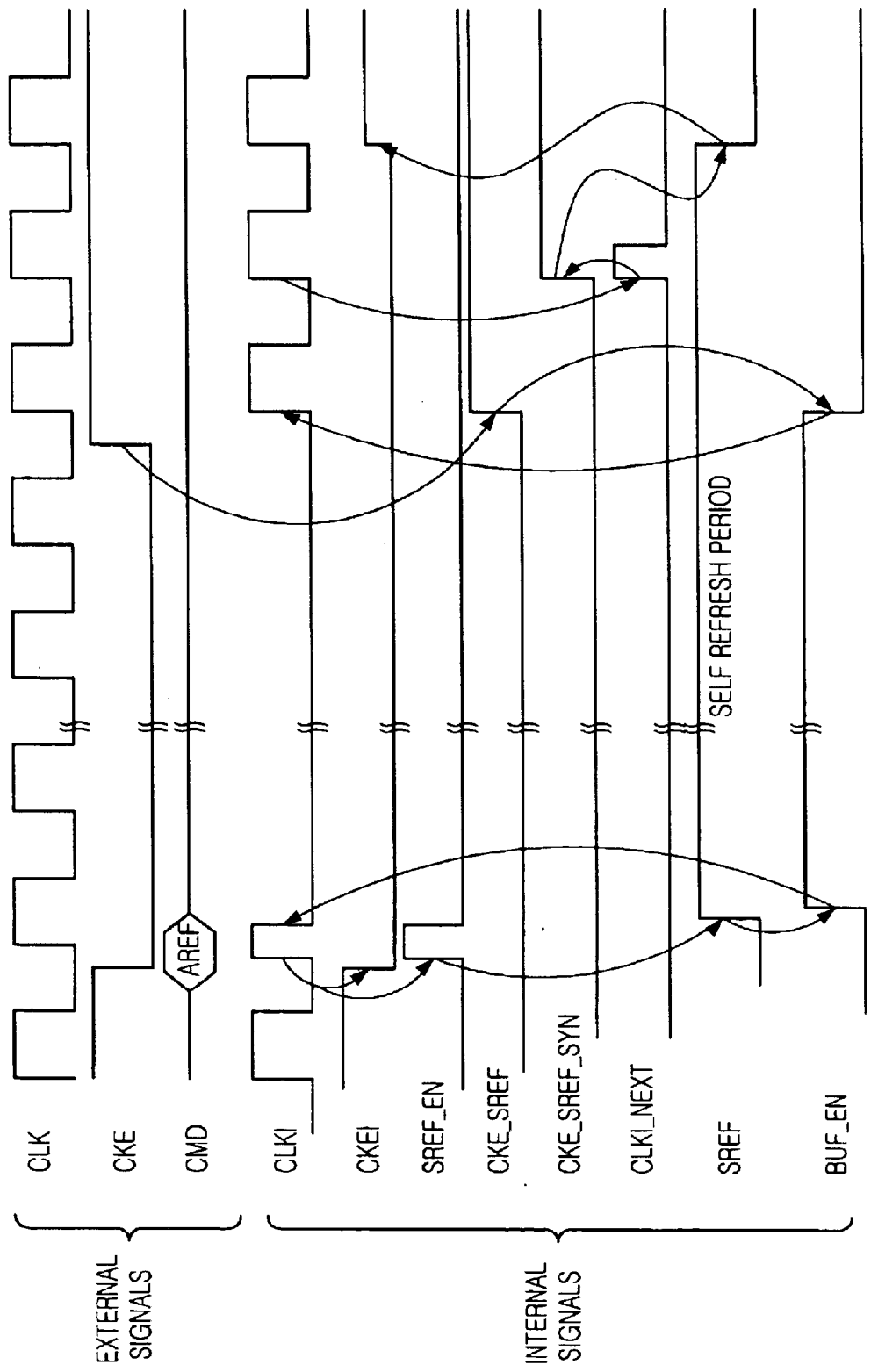
FIG. 4 is a timing diagram showing a self refresh operation of the semiconductor memory device in accordance with the present invention.

FIG. 4 is a timing diagram demonstrating the self refresh operation of the semiconductor memory device in accordance with the present invention.

As shown, the self refresh entry signal SREF_EN becomes in a logic 'HIGH' level synchronizing with the internal clock signal CLKI after the internal clock enable signal CKEI becomes inactivated. After that, the self refresh signal SREF is activated to a logic 'HIGH' level, and the semiconductor memory device is in the self refresh operation.

Thereafter, the buffer control signal BUF_EN becomes in a logic 'HIGH' level in response to the self refresh signal SREF, and, the clock buffer 103 is disabled by the buffer control signal BUF_EN.

Meanwhile, during the self refresh operation, the second clock enable buffer 201 is enabled and outputs the self refresh exit control signal CKE_SREF from the inputted clock enable signal CKE.

If the self refresh exit control signal CKE_SREF becomes in a logic 'HIGH' level during the self refresh operation, the buffer control signal BUF_EN becomes in a logic 'LOW' level and the clock buffer 103 is enabled. Therefore, the internal clock signal CLKI is outputted from the clock buffer 103.

Thereafter, the pulse signal CLKI_NEXT becomes in a logic 'HIGH' level synchronizing with the second rising edge of the internal clock signal CLKI. Then, the self refresh exit signal CKE_SREF_EN is activated to a logic 'HIGH' level synchronizing with the pulse signal CLKI_NEXT.

Therefore, the semiconductor memory device is out of the self refresh operation.

Figure 5:
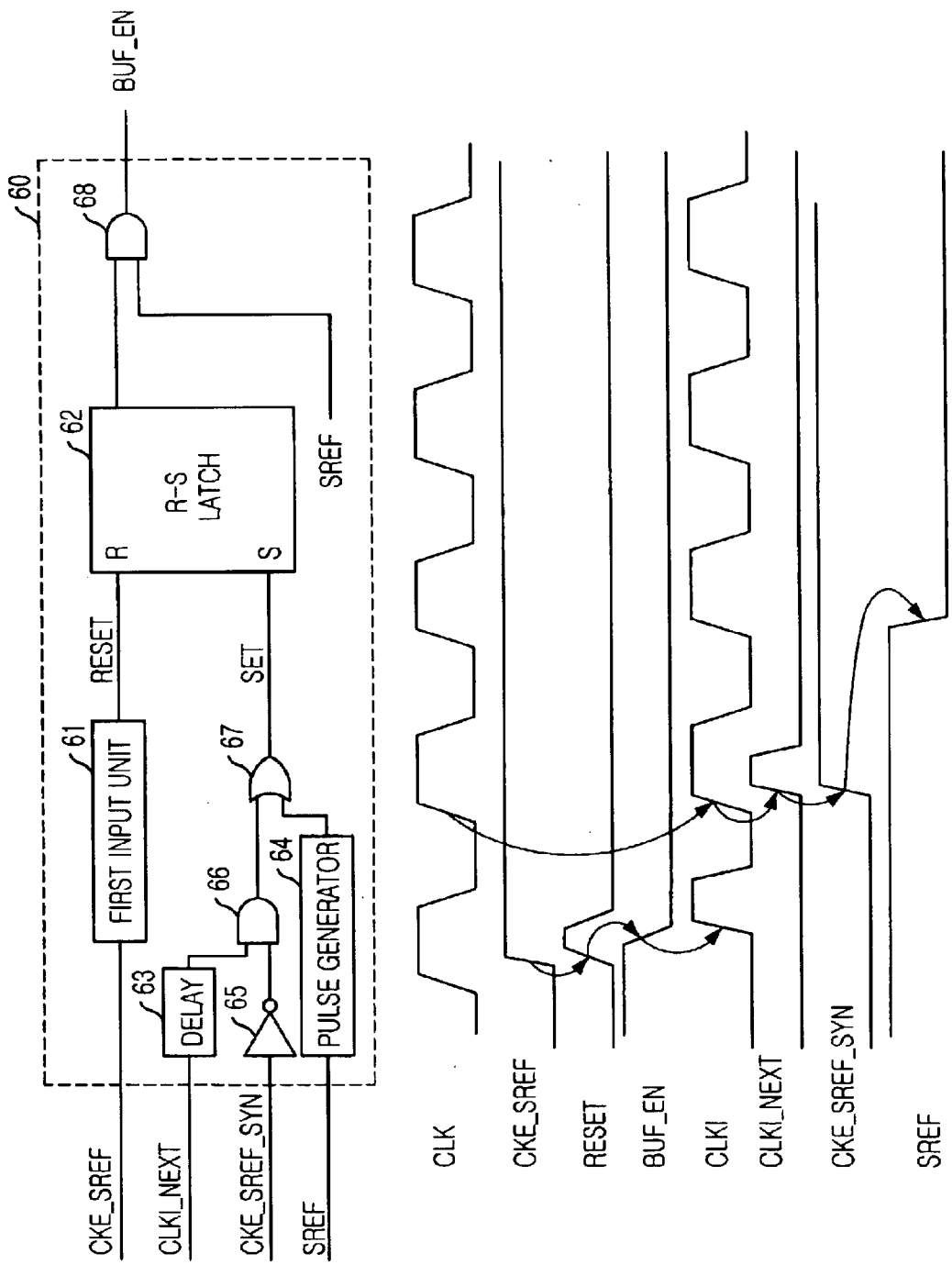
FIG. 5 is a circuit diagram and a timing diagram showing an embodiment of a clock buffer controller and an operation of the clock buffer controller.

FIG. 5 shows a circuit diagram and a timing diagram. The circuit diagram shows an embodiment of the clock buffer controller 60 and the timing diagram shows an operation of the clock buffer controller 60.

As shown, the clock buffer controller 60 includes a first input unit 61, a second input unit, an RS-LATCH 62 and an output unit 68.

The first input unit 61 is embodied by a pulse generator and generates a reset pulse signal RESET by detecting a rising edge of the self refresh exit control signal CKE_SREF outputted from the second clock enable buffer 201.

The second input unit generates a set signal SET if the self refresh signal SREF is activated; or, if the pulse signal CLKI_NEXT is activated and the self refresh exit signal CKE_SREF_SYN is inactivated.

The second input unit is provided with a delay 63, an inverter 65, a pulse generator 64, an AND gate 66 and an OR gate 67.

The delay 63 delays the pulse signal CLKI_NEXT and the inverter 65 inverts the self refresh exit signal CKE_SREF_SYN. The AND gate 66 performs a logic AND operation on the two outputted signals from the delay 63 and the inverter 65. The pulse generator 64 generates a pulse signal synchronizing with a rising edge of the refresh signal SREF. The OR gate 67 performs a logic OR operation on the two outputted signals from the AND gate 66 and the pulse generator 64.

The RS-LATCH receives the reset signal RESET and the set signal SET. The output unit 68 is embodied by an AND gate and performs a logic AND operation on the outputted signal from the RS-LATCH 67 and the refresh signal SREF, then, outputs the buffer control signal BUF_EN.

Referring to the timing diagram, if the self refresh signal SREF becomes in a logic 'HIGH' level, the set signal SET and buffer control signal BUF_EN become in a logic 'HIGH' level. After that, if the self refresh exit control signal CKE_SREF becomes in a logic 'HIGH' level, the reset signal RESET is generated for resetting the RS-LATCH 62, then, the buffer control signal BUF_EN becomes in a logic 'LOW' level.

Figure 6:
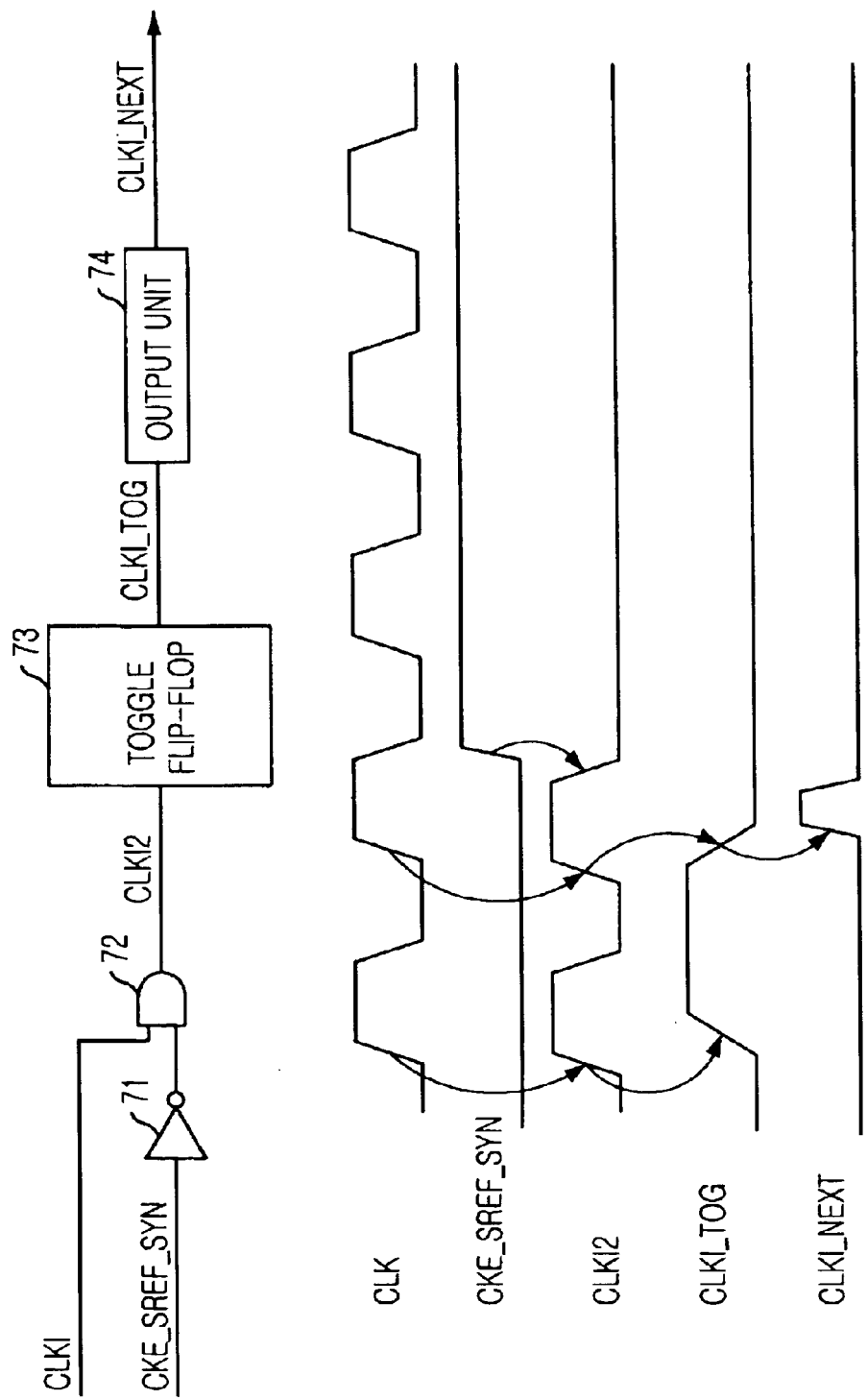
FIG. 6 is a circuit diagram and a timing diagram showing an embodiment of a next clock generator and an operation of the next clock generator.

FIG. 6 shows a circuit diagram and a timing diagram. The circuit diagram shows an embodiment of the next clock generator 70 and the timing diagram shows operation of the next clock generator 70.

As shown, the next clock generator 70 includes an input unit, a toggle flip-flop 73 and a pulse generator 74; herein, the input unit is provided with an inverter 71 and an AND gate 72.

The input unit receives the internal clock signal CLKI and the self refresh exit signal CKE_SREF_SYN; and, transfers the internal clock signal CLKI to the toggle flip-flop 73 if the self refresh exit signal CKE_SREF_SYN is inactivated, where the transferred internal clock signal CLKI is renamed as CLKI2.

The input unit is provided with an inverter 71 and an AND gate 72. The inverter 71 inverts the self refresh exit signal CKE_SREF_SYN. The AND gate 72 performs logic AND operation on the internal clock signal CLKI and the outputted signal from the inverter 71.

The toggle flip-flop 73 receives the outputted signal CLKI2 from the AND gate 72 and generates a toggle signal CLKI_TOG. The toggle signal CLKI_TOG toggles at rising edges of the CLKI2.

The output unit 74 is embodied by a pulse generator. The output unit 74 generates the pulse signal CLKI_NEXT at a falling edge of the CLKI_TOG.

Referring to the timing diagram shown in FIG. 6, if the internal clock signal CLKI is inputted, the toggle signal CLKI_TOG is generated from the toggle flip-flop 73. Then, the pulse signal CLKI_NEXT is generated synchronizing with a falling edge of the CLKI_TOG.

While the present invention has been described with respect to the particular embodiments, it will be apparent to those skilled in the art that various changes and modifications may be made without departing from the spirit and scope of the invention as defined in the following claims.

What is claimed is:

1. A self refresh control apparatus, for use in a semiconductor memory device, comprising:
    a self refresh entry unit having at least one clock buffer for generating a self refresh entry signal in response to an external control signal, wherein the clock buffer generates a clock signal in response to an external clock signal and a clock buffer enable signal;
    a self refresh exit unit for generating a first self refresh exit signal in response to the external control signal and generating a second self refresh exit signal synchronized with the clock signal;
    a clock buffer controller for generating the clock buffer enable signal in response to the first self refresh exit signal; and
    a self refresh signal generator for generating a self refresh signal in response to the self refresh entry signal and the second self refresh exit signal, wherein the self refresh signal is fed back and input to the self refresh entry unit.

2. The self refresh control apparatus as recited in claim 1, wherein the self refresh entry signal is synchronized with the external clock signal.

3. The self refresh control apparatus as recited in claim 2, wherein the second self refresh exit signal is synchronized with the external clock signal.

4. The self refresh control apparatus as recited in claim 1, wherein the self refresh entry unit includes:
    a command buffer for receiving a plurality of command signals to output a plurality of internal command signals;
    a first clock enable buffer for receiving the external control signal to output an internal clock enable signal;
    a clock buffer for receiving the external clock signal and the clock buffer enable signal in order to generate the clock signal; and
    a self refresh entry command generator for generating the self refresh entry signal in response to the clock signal, the internal clock enable signal and the plurality of internal command signals.

5. The self refresh control apparatus as recited in claim 1, wherein the self refresh exit unit includes:
    a second clock enable buffer for generating the first self refresh exit signal in response to the external control signal;
    a next clock generator for generating a pulse signal synchronizing with the second clock of the clock signal; and
    a synchronizing circuit unit for generating the second self refresh exit signal by synchronizing the first self refresh exit signal with the pulse signal.

6. The self refresh control apparatus as recited in claim 1, wherein the clock buffer controller includes:
    a first input unit for generating a reset signal in response to the first self refresh exit signal;
    a second input unit for generating a set signal in response to the second self refresh exit signal, the self refresh signal and the pulse signal;
    an RS-LATCH which receives the set signal and the reset signal; and
    an output unit for generating the clock buffer enable signal in response to an outputted signal from the RS-LATCH and the self refresh signal.

7. A self refresh control apparatus included in a semiconductor memory device, comprising:
    a self refresh entry unit for generating a self refresh entry signal;
    a clock buffer controller for disabling a clock buffer included in the self refresh entry unit during a self refresh operation, and for enabling the clock buffer if a self refresh exit control signal is activated during the self refresh operation;
    a self refresh exit unit for generating a self refresh exit signal by synchronizing the self refresh exit control signal with a pulse signal outputted from a next clock signal included in the self refresh exit unit; and
    a self refresh signal generator for generating a self refresh signal for determining a period of the self refresh operation,
    wherein the self refresh control apparatus controls start or end of the self refresh operation by using single clock buffer and the self refresh signal is fed back and input to the self refresh entry unit.

8. The self refresh control apparatus as recited in claim 7, wherein the self refresh exit unit includes:
    a clock enable buffer for outputting the self refresh exit control signal during the self refresh operation;
    the next clock generator for generating the pulse signal by detecting the second clock of an outputted clock signal from the clock buffer; and
    a synchronizing circuit unit for generating the self refresh exit signal by synchronizing the self refresh exit signal from the clock enable buffer with the pulse signal from the next clock generator.

9. The self refresh control apparatus as recited in claim 8, wherein the clock buffer controller includes:
    a first input unit for generating a reset signal by detecting transition point of the self refresh exit control signal outputted from the clock enable buffer;
    a second input unit for generating a set signal in response to the self refresh exit signal, the self refresh signal and the pulse signal;
    an RS-LATCH which receives the set signal and the reset signal; and
    an output unit for generating a buffer control signal for controlling the clock buffer in response to an outputted signal from the RS-LATCH and the self refresh signal.

10. The self refresh control apparatus as recited in claim 8, wherein the next clock generator includes:
    an input unit for transferring the outputted clock signal from the clock buffer if the self refresh exit signal becomes inactivated;
    a means for generating a toggle signal which toggles at a rising edge of an outputted signal from the input unit; and
    an output unit for generating the pulse signal by synchronizing with an falling edge of the toggle signal.

11. The self refresh control apparatus as recited in claim 7, the self refresh entry unit includes:

a command buffer which receives a plural number of control signal operating during normal operation;

a first clock enable buffer which receives a clock enable signal operating during normal operation;

a clock buffer for receiving a clock signal; and a self refresh entry command generator for generating a self refresh entry signal in response to outputted signals from the command buffer, the first clock enable buffer and the clock buffer.

12. A self refresh control method for a semiconductor memory device, comprising a step of:

generating a self refresh entry signal by synchronizing it with an external clock signal outputted from a clock buffer;

disabling the clock buffer at a self refresh operation;

transferring a clock enable signal to inside of the semiconductor memory device;

enabling the clock buffer if the clock enable signal is activated during the self refresh operation;

generating a self refresh exit signal by synchronizing the clock enable signal with an outputted signal from the clock buffer; and generating a self refresh signal in response to the self refresh entry signal and the self exit signal, wherein the self refresh signal is fed back for determining a period of the self refresh operation.

13. The self refresh control method as recited in claim 12, wherein the step of generating the self refresh exit signal further includes a step of:

generating a pulse signal by detecting a rising edge of the second clock of the outputted signal from the clock buffer; and generating the self refresh exit signal by synchronizing the clock enable signal with the pulse signal.

* * * * *

UNITED STATES PATENT AND TRADEMARK OFFICE
CERTIFICATE OF CORRECTION

PATENT NO. : 6,961,278 B2 Page 1 of 1
APPLICATION NO. : 10/747937
DATED : November 1, 2005
INVENTOR(S) : Jeong It is certified that error appears in the above-identified patent and that said Letters Patent is hereby corrected as shown below:

Column 7, line 33
In Claim #1, after " unit" please insert -- 100A --.

Signed and Sealed this

Seventeenth Day of October, 2006

JON W. DUDAS
*Director of the United States Patent and Trademark Office*